United States Patent
Fonville

(10) Patent No.: US 12,507,366 B2
(45) Date of Patent: Dec. 23, 2025

(54) FLOATING COLD PLATE SPIGOT SEALING SYSTEM

(71) Applicant: GM GLOBAL TECHNOLOGY OPERATIONS LLC, Detroit, MI (US)

(72) Inventor: Carl E. Fonville, Ann Arbor, MI (US)

(73) Assignee: GM Global Technology Operations LLC, Detroit, MI (US)

(*) Notice: Subject to any disclaimer, the term of this patent is extended or adjusted under 35 U.S.C. 154(b) by 231 days.

(21) Appl. No.: 18/320,334

(22) Filed: May 19, 2023

(65) Prior Publication Data

US 2024/0389254 A1    Nov. 21, 2024

(51) Int. Cl.
*H05K 7/20* (2006.01)
*F28F 9/02* (2006.01)
*H05K 5/06* (2006.01)

(52) U.S. Cl.
CPC ........... *H05K 5/069* (2013.01); *F28F 9/0251* (2013.01); *H05K 7/20845* (2013.01); *H05K 7/20872* (2013.01); *F28F 2230/00* (2013.01)

(58) Field of Classification Search
CPC .............. H05K 5/069; H05K 7/20845; H05K 7/20872; F16L 5/06; F16L 5/10
See application file for complete search history.

(56) References Cited

U.S. PATENT DOCUMENTS

| 8,474,877 | B2 * | 7/2013 | Smith | F16L 37/091 |
| | | | | 285/305 |
| 2004/0094951 | A1 * | 5/2004 | Sigrist | F16L 5/06 |
| | | | | 285/354 |
| 2021/0012687 | A1 * | 1/2021 | Li | G06F 1/1677 |

FOREIGN PATENT DOCUMENTS

DE       102005048100 A1 *  4/2007   ............... G06F 1/20

* cited by examiner

*Primary Examiner* — Eric S Ruppert
(74) *Attorney, Agent, or Firm* — Quinn IP Law

(57) ABSTRACT

A floating cold plate spigot sealing system for a vehicle includes an electronic module, disposed within an electronic module compartment attached to a vehicle, a floating cold plate having a spigot, disposed adjacent to the electronic module, and a cover having a coolant opening, disposed adjacent to the electronic module, a spigot seal disposed in the coolant opening. The spigot extends through the spigot seal, which includes a lower housing having at least one seal, and a nut that is engageable with the lower housing to form a seal between the spigot seal and the spigot. The at least one seal includes a first seal disposed between an inner surface of the vertical portion of the lower housing and the outer surface of the spigot, and a second seal disposed between the bottom surface of the cover and a bottom surface of the horizontal portion of the lower housing.

19 Claims, 4 Drawing Sheets

FLOATING COLD PLATE SPIGOT SEALING SYSTEM

INTRODUCTION

The present disclosure generally relates to spigot sealing systems and, more particularly, to a floating cold plate spigot sealing system for a vehicle, which seals along a plurality of axes.

Cold plates may be used to transfer heat from surfaces with high heat loads, for example, an electronic component or a battery, to a fluid, or coolant, in a cold plate system. The cold plate system generally includes a cold plate in fluid communication with a cooling system including a heat exchanger. The cold plate system may be a stand-alone system, or part of and/or in communication with a vehicle cooling system.

A cold plate may be placed in direct contact with an electronic component, battery or other vehicle component that may generate a high heat load during use. As coolant flows through the cold plate system, the high heat load generated by the electronic component or battery is dissipated through a transfer of heat from the electronic component or battery to the coolant, which then flows through the heat exchanger, transferring the heat to, for example, ambient air or another portion of a vehicle cooling system.

In some configurations, an electronic component or battery may be disposed within an electronic component or battery compartment, adjacent to a cold plate. A cover may be disposed adjacent to the electronic component or battery, on an opposite side of the electronic component or battery from the cold plate, to prevent moisture and debris from entering the electronic component or battery compartment containing the electronic component or battery.

In these configurations, however, coolant is typically supplied to the cold plate through a spigot that extends upward from the cold plate. through the electronic component or battery compartment. The spigot may include a stanchion portion and a connection portion, for example, a quick connect fitting, which extends upward through the electronic component or battery compartment and through an opening in the cover, where the spigot may be connected via the connection portion, for example, a quick connect to, for example, a vehicle cooling system, which provides coolant to the cold plate. As the cover includes an opening to accommodate the spigot, a potential exists for moisture and/or debris to also enter the electronic component or battery compartment through the opening in the cover and possibly damage the electronic component or battery disposed within.

SUMMARY

It is therefore useful to develop a floating cold plate spigot sealing system for a vehicle that includes a cover having a spigot seal that seals along a plurality of axes. More specifically, it is useful that the spigot seal locates on a spigot of a floating cold plate in an XY-direction, slides onto the spigot in a Z-direction, and slides with respect to the cover in an XY-direction.

Additionally, it is useful that the spigot seal, seals with respect to the spigot of the floating cold plate, and seals with respect to the cover, which is generally formed from a sheet molded compound, without deforming the cover.

According to one aspect of the present disclosure, a floating cold plate spigot sealing system for a vehicle may include an electronic module attached to a vehicle, a floating cold plate having a spigot, disposed adjacent to the electronic module, and a cover having a coolant opening, disposed adjacent to the electronic module.

A spigot seal may be disposed in the coolant opening of the cover, such that the spigot of the floating cold plate through the spigot seal disposed in the coolant opening of the cover. The spigot seal may include a lower housing having at least one seal, and a nut that is engageable with the lower housing to form a seal between the spigot seal and the cover.

A cooling system may be attached to the vehicle to provide coolant to the floating cold plate through the spigot.

The lower housing may include a horizontal portion, and a vertical portion. The horizontal portion may be adjacent to a bottom surface of the cover, and the vertical portion of the lower housing may be adjacent to an outer surface of the spigot, when the cover is disposed adjacent to the electronic module.

The at least one seal may include a first seal and a second seal. The first seal may be disposed between an inner surface of the vertical portion of the lower housing and the outer surface of the spigot. The second seal may be disposed between the bottom surface of the cover and an inner surface of the horizontal portion of the lower housing.

The first seal may be compressible between the vertical portion of the lower housing and the spigot, when the spigot is received within the spigot seal.

The second seal may be compressible between the horizontal portion of the lower housing and the bottom surface of the cover when the spigot is received with in the spigot seal and the nut is engaged with the lower housing to form the seal between the spigot seal and the cover.

The lower housing may include a threaded portion on an outer surface of a vertical portion of the lower housing.

The nut may include a threaded portion that is engageable with the threaded portion of the vertical portion of the lower housing.

The floating cold plate may include at least one anti-rotation feature. The lower housing may include at least one complementary anti-rotation feature that is engageable with the at least one anti-rotation feature of the floating cold plate.

The electronic module may include a binary data unit.

The spigot may include a stanchion portion and a connection portion.

According to another aspect of the present disclosure, a floating cold plate spigot sealing system for a vehicle may include an electronic module attached to a vehicle, a floating cold plate including a spigot, and a cover including a spigot seal disposed within a coolant opening of the cover. The floating cold plate is disposed adjacent to a first side of the electronic module. The cover is disposed adjacent to a second side of the electronic module. The second side of the electronic module is opposite the first side of the electronic module.

The spigot of the floating cold plate may extend through the spigot seal to form a seal between the spigot and the spigot seal. The spigot seal may include a lower housing having at least one seal and a nut. The nut may be engageable with the lower housing to form a seal between the spigot seal and the cover.

A cooling system may provide coolant to the floating cold plate through the spigot.

According to another aspect of the present disclosure, a method of sealing a floating cold plate spigot for a vehicle may include: attaching an electronic module to a vehicle; disposing a floating cold plate, having a spigot, adjacent to the electronic module; providing a cover having a coolant opening, and a spigot seal disposed within the coolant opening; disposing the cover adjacent to the electronic module, such that the spigot of the floating cold plate extends through the spigot seal; attaching the cover to the electronic module compartment using a plurality of fasteners; rotating the nut of the spigot seal with respect to the lower housing of the spigot seal, creating a seal between the cover and the spigot seal; and providing coolant from a cooling system to the floating cold plate through the spigot.

The spigot seal may include a lower housing including at least one seal, and a nut that may be engageable with the lower housing to form a seal between the spigot seal and the cover.

The lower housing may include a horizontal portion, adjacent to a bottom surface of the cover, and a vertical portion. The vertical portion of the lower housing may be adjacent to an outer surface of the spigot when the cover is disposed adjacent to the electronic module.

The at least one seal may include a first seal and a second seal.

The first seal may be disposed between an inner surface of the vertical portion of the lower housing and the outer surface of the spigot. The second seal may be disposed between the bottom surface of the cover and an inner surface of the horizontal portion of the lower housing.

Disposing the cover adjacent to the electronic module may include compressing the first seal between the vertical portion of the lower housing and the spigot, and engaging the nut with the lower housing to compress the second seal between the horizontal portion of the lower housing and the cover.

The lower housing may include a threaded portion on the outer surface of the vertical portion, and the nut may include a threaded portion that is engageable with the threaded portion of the vertical portion of the lower housing.

Engaging the nut may include rotating the nut with respect to the spigot.

The floating cold plate may include at least one anti-rotation feature. The lower housing may include at least one complementary anti-rotation feature that is engageable with the anti-rotation feature of the floating cold plate when the nut is engaged with the lower housing to compress the second seal between the horizontal portion of the lower housing and the cover.

The electronic module may include a binary data unit.

The spigot may include a stanchion portion and a connection portion.

Accordingly, the presently disclosed floating cold plate sealing system for a vehicle seals along a plurality of axes by providing a cover including a spigot seal that locates on a spigot of a floating cold plate in an XY-direction, slides onto the spigot in a Z-direction, creating a seal between the spigot and the cover, and slides with respect to the cover in an XY-direction, to seal against the cover.

Additionally, while sealing along the plurality of axes, the spigot seal also seals with respect to the spigot of the floating cold plate, and with respect to the cover, which is generally formed from a sheet molded compound, without deforming the cover.

The above features and advantages and other features and advantages of the present teachings are readily apparent from the following detailed description of the modes for carrying out the present teachings when taken in connection with the accompanying drawings.

BRIEF DESCRIPTION OF THE DRAWINGS

The accompanying drawings, which are incorporated into and constitute a part of this specification, illustrate implementations of the disclosure and, together with the description, serve to explain the principles of the disclosure.

DETAILED DESCRIPTION

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Figure 1:
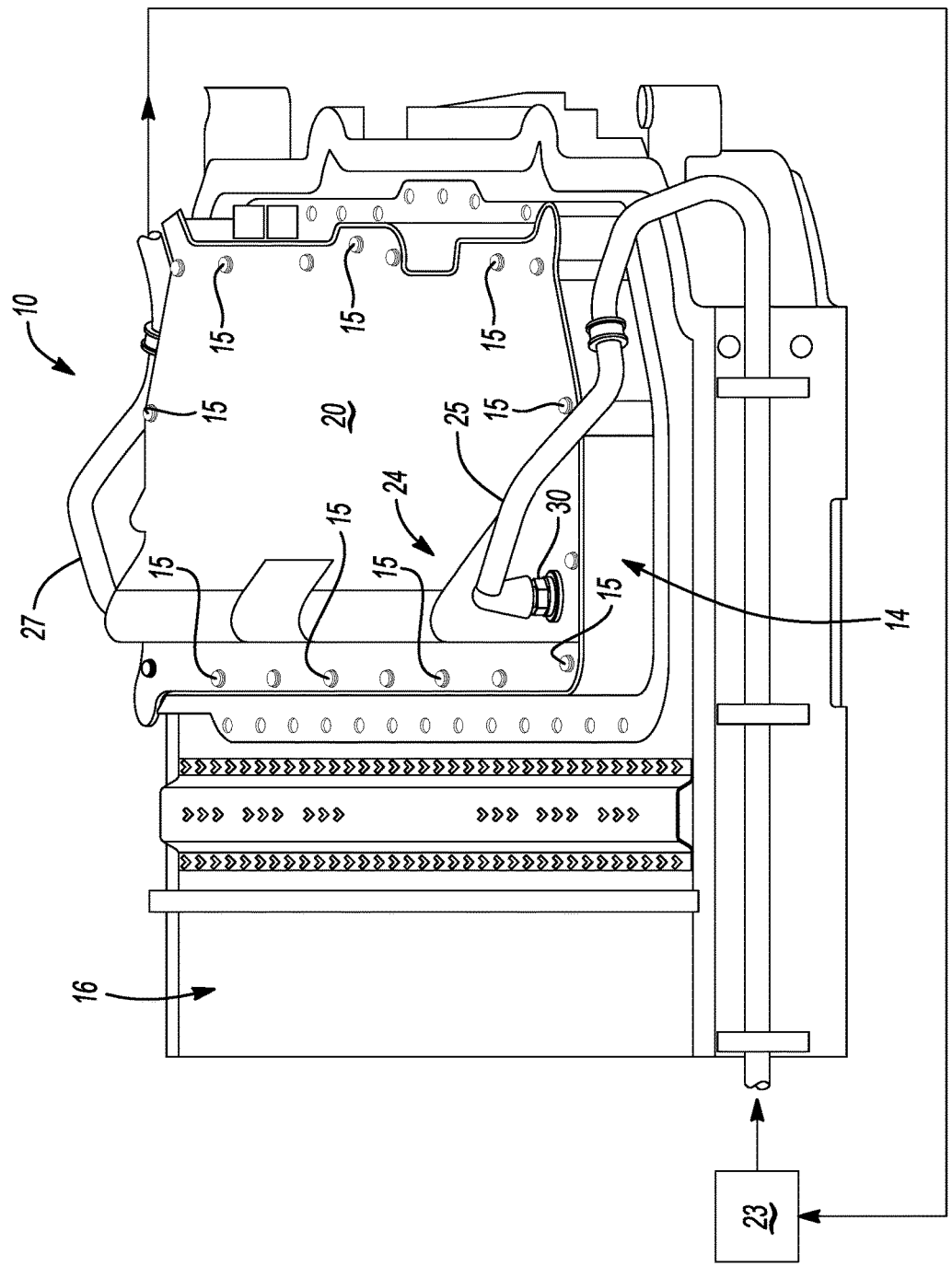
FIG. 1 is a schematic illustration of a portion of a vehicle including a floating cold plate spigot sealing system in accordance with the present disclosure.
Figure 2:
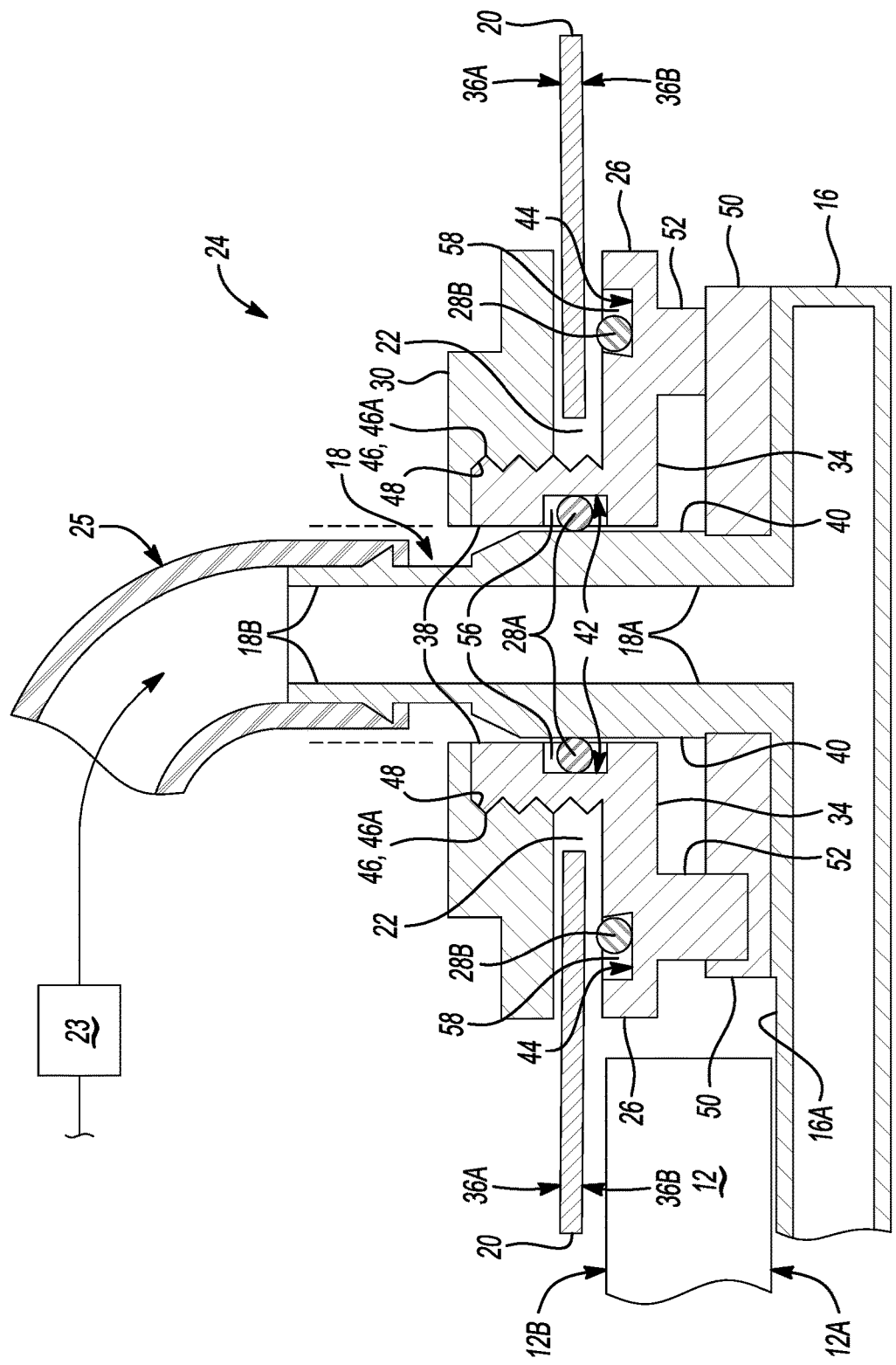
FIG. 2 is a cutaway schematic illustration of a floating cold plate spigot sealing system in accordance with the present disclosure.

With reference to FIGS. 1 and 2, a floating cold plate spigot sealing system 10 for a vehicle (not shown) includes an electronic module 12 (FIG. 2), disposed within an electronic module compartment 14 attached to the vehicle (not shown), a floating cold plate 16 having a spigot 18 disposed adjacent to the electronic module 12 within the electronic module compartment 14, and a cover 20 disposed adjacent to the electronic module 12. The cover 20, which includes a spigot seal 24 disposed within a coolant opening 22 (FIG. 2), is attached to the electronic module compartment 14 via a plurality of perimeter fasteners 15, for example, but not limited to, a plurality of bolts.

Coolant is provided to the floating cold plate 16 from a cooling system 23 via an inlet cooling line 25 connected to the spigot 18. As coolant flows through the floating cold plate 16, heat is transferred from the electronic module 12, disposed within the electronic module compartment 14, to the coolant, which then flows back to the cooling system 23 via an outlet cooling line 27, where the heat is transferred from the coolant via, for example, a heat exchanger (not shown) within the cooling system 23 to, for example, ambient air or another portion of a vehicle cooling system (not shown).

It should be appreciated that, while coolant is disclosed above, other fluids, for example, but not limited to, water or gases, may be provided in place of the coolant.

As illustrated in FIG. 2, an electronic module 12 is disposed adjacent to a top surface 16A of a floating cold plate 16, and a bottom surface 36 of a cover 20. The floating cold plate includes a spigot 18. The cover 20 includes a spigot seal 24 disposed within a coolant opening 22 of the cover 20. The spigot 18 of the floating cold plate 16 is received within the spigot seal 24 of the cover 20, such that the spigot 18 of the floating cold plate 16 extends through the spigot seal 24 when the cover 20 is disposed adjacent to the electronic module 12.

The spigot seal 24 includes a lower housing 26 having at least one seal 28, and a nut 30.

The lower housing 26 of the spigot seal 24, which is arranged between the cover 20 and the floating cold plate 16, includes a horizontal portion 34 and a vertical portion 38. The horizontal portion 34 of the lower housing 26, which includes a groove 58, for example, but not limited to, a half dovetail groove, is adjacent to the bottom surface 36 of the cover 20. The vertical portion 38 of the lower housing 26, which includes a groove 56, is perpendicular to the horizontal portion 34 of the lower housing 26, and adjacent to an outer surface 40 of the spigot 18 when the cover 20 is disposed adjacent to an electronic module 12.

The at least one seal 28 may include a first seal 28A and a second seal 28B. The first seal 28A is disposed between an inner surface 42 of the groove 56 in the vertical portion 38 of the lower housing 26 and the outer surface 40 of the spigot 18 to create a seal between the vertical portion 38 of the lower housing 26 of the spigot seal 24 and outer surface 40 of the spigot 18.

The second seal 28B is disposed between the bottom surface 36 of the cover 20 and an inner surface 44 of the groove 58 in the horizontal portion 34 of the lower housing 26. The nut 30 is engageable with the lower housing 26 to create a seal between the horizontal portion 34 of the spigot seal 24 and the cover 20.

A cooling system, schematically illustrated at 23, is attached to the vehicle (not shown) to provide coolant to the floating cold plate 16, via an inlet cooling line 25 connected to the spigot 18.

The first seal 28A is compressible between the vertical portion 38 of the lower housing 26 and the spigot 18, when the cover 20, including the spigot seal 24, is disposed on the spigot 18 of the floating cold plate 16, to form a seal between the spigot 18 and the spigot seal 24. That is, when the spigot 18 of the floating cold plate 16 is received within the spigot seal 24.

The second seal 28B is compressible between the horizontal portion 34 of the lower housing 26 and the bottom surface 36 of the cover 20 when the spigot 18 of the floating cold plate 16 is received within the spigot seal 24, and the nut 30 is engaged with the lower housing 26 to form the seal between the spigot seal and the cover 20.

The lower housing 26 includes a threaded portion 46A on an outer surface 46 of a vertical portion 38 of the lower housing 26.

The nut 30 includes a threaded portion 48 that is engageable with the threaded portion 46A of the vertical portion 38 of the lower housing 26.

The floating cold plate 16 includes at least one anti-rotation feature 50. The lower housing 26 include at least one complementary anti-rotation feature 52 that is engageable with the at least one anti-rotation feature 50 of the floating cold plate 16.

The at least one anti-rotation feature 50 may include, for example, but not limited to, two tabs, and the at least one complementary anti-rotation feature 52 may include, for example, but not limited to, two complementary tabs.

The electronic module 12 includes a binary data unit.

Figure 3:
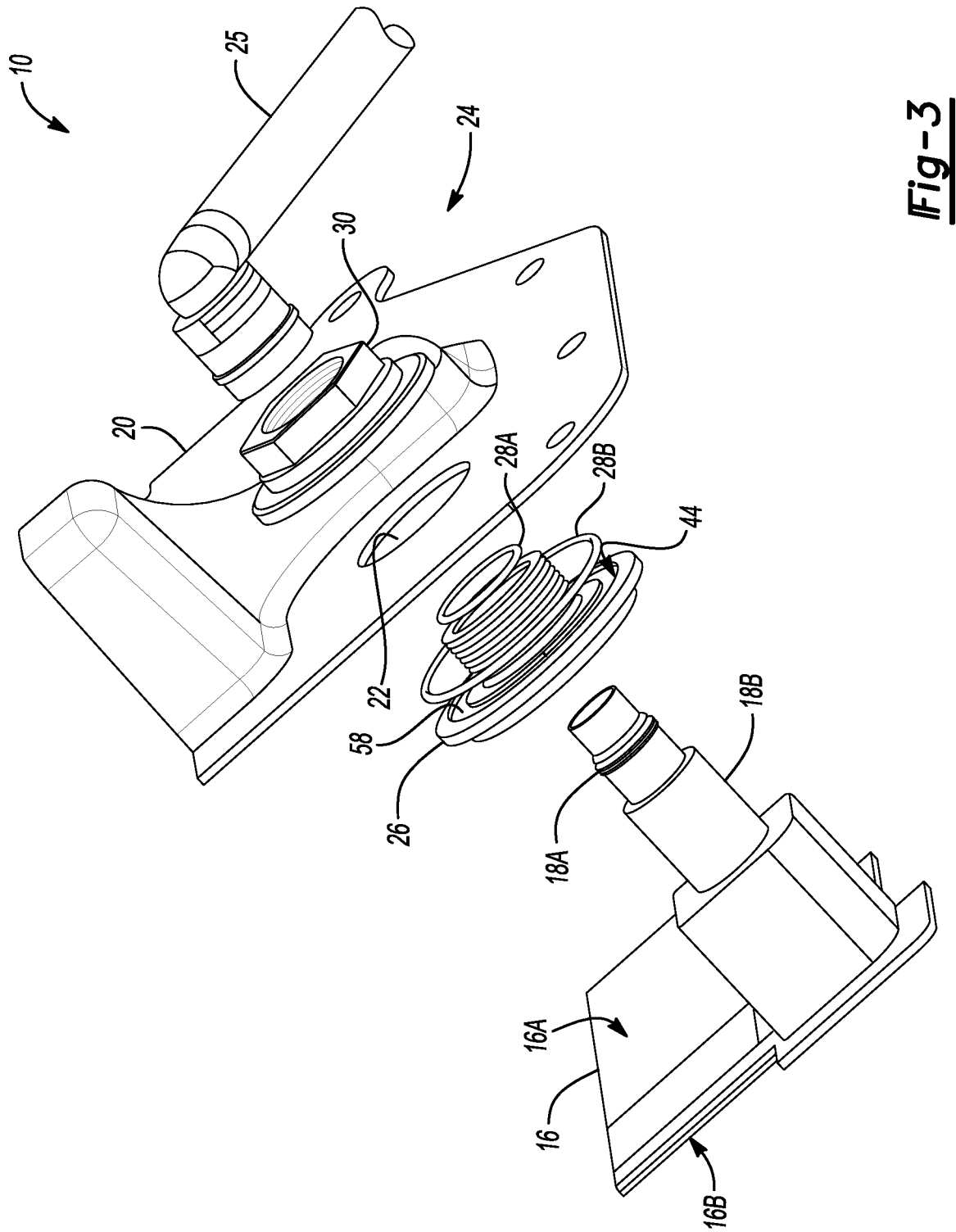
FIG. 3 is an exploded schematic illustration of a floating cold plate spigot sealing system in accordance with the present disclosure.

As illustrated in FIG. 3, a floating cold plate sealing system 10 includes a floating cold plate 16 having a spigot 18, a lower housing 26, a cover 20, and nut 30.

The spigot 18 includes a stanchion portion 18A and a connection portion 18B. The stanchion portion 18A extends upward from a top surface 16A of a floating cold plate 16 and the connection portion 18B extends upward from the stanchion portion 18A.

The lower housing 26 includes a horizontal portion 34 and a vertical portion 38. The horizontal portion 34 of the lower housing 26, which includes a groove 58, for example, but not limited to, a half dovetail groove, is adjacent to the bottom surface 36 of the cover 20. The vertical portion 38 of the lower housing 26, which includes a groove 56, is perpendicular to the horizontal portion 34 of the lower housing 26, and adjacent to an outer surface 40 of the spigot 18 when the cover 20 is disposed adjacent to an electronic module 12.

The lower housing 26 includes a threaded portion 46A on an outer surface 46 of a vertical portion 38 of the lower housing 26.

The cover 20 includes a coolant opening 22, through which the vertical portion 38 of the lower housing 26 is receivable.

The nut 30 includes a threaded portion 48 that is engageable with the threaded portion 46A of the vertical portion 38 of the lower housing 26.

A first seal 28A, for example but not limited to an O-ring, is disposed in the groove 56 within the vertical portion 38 of the lower housing 26. The first seal 28A is compressible between the vertical portion 38 of the lower housing 26 and the stanchion portion 18A of the spigot 18.

The second seal 28B, for example, but not limited to an O-ring, is disposed in the groove 58, in a horizontal portion 26 of the lower housing 26.

A cooling system, schematically illustrated at 23 (FIGS. 1 and 2), provides coolant to the floating cold plate 16 through the spigot 18 via an inlet cooling line 25.

According to another aspect of the present disclosure, a floating cold plate spigot sealing system 10 for a vehicle (not shown) includes an electronic module 12, disposed within an electronic module compartment 14 attached to a vehicle (not shown), a floating cold plate 16 disposed adjacent to a first side 12A of the electronic module 12, a cover 20 disposed adjacent to a second side 12B of the electronic module 12. The second side 12B of the electronic module 12 is opposite the first side 12A of the electronic module 12.

The cover 20 is attached to the electronic control module compartment via a plurality of perimeter fasteners 15, for example, a plurality of bolts.

A spigot seal 24 is disposed within a coolant opening 22 of the cover 20. A spigot 18 of a floating cold plate 16 extends through the spigot seal 24. The spigot seal 24 includes a lower housing 26 having a first seal 28A and a second seal 28B, and a nut 30. The nut 30 is engageable with the lower housing 26 to form a seal between the spigot seal 24 and the cover 20. The nut 30 is disposed on a top surface 36A of the cover 20, to provide access to the nut 30 facilitate engagement of the nut 30 with the lower housing 26.

A cooling system 23 provides coolant to the floating cold plate 16 via an inlet cooling line 25 connected to the spigot 18.

Figure 4:
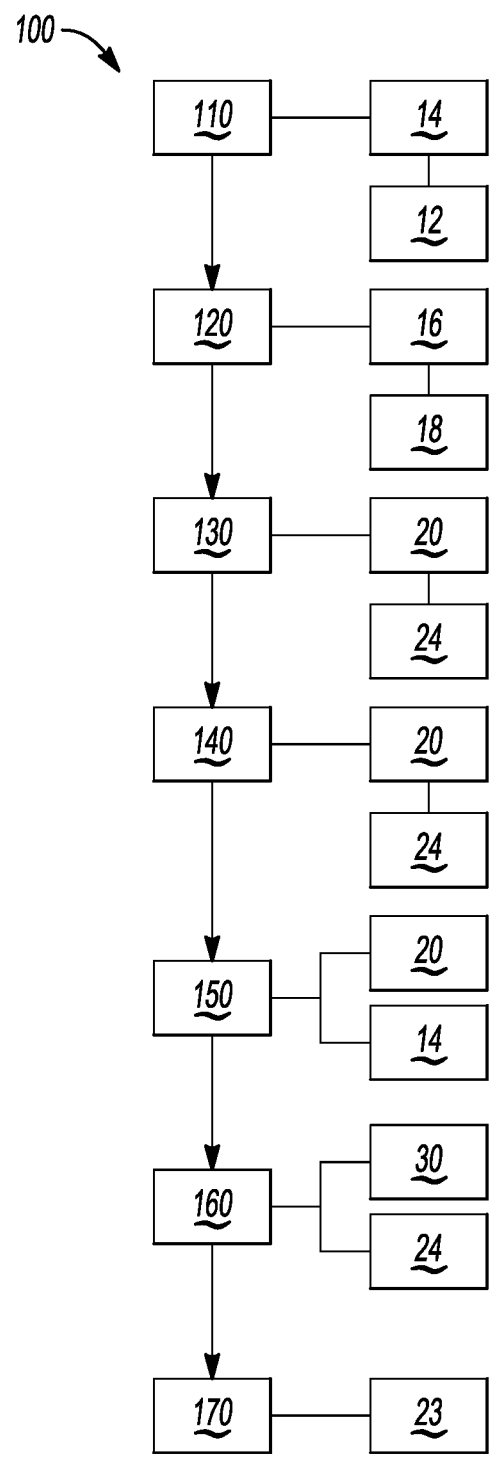
FIG. 4 is a flow chart illustrating a method of sealing a floating cold plate spigot for a vehicle in accordance with the present disclosure.

According to another aspect of the present disclosure, as illustrated in FIG. 4, a method 100 of sealing a floating cold plate spigot for a vehicle may include: attaching 110 an electronic module 12, disposed within an electronic module compartment 14, to a vehicle; disposing 120 a floating cold plate 16, having a spigot 18, adjacent to the electronic module 12; providing 130 a cover 20 having a coolant opening 22, and a spigot seal 24 disposed in the coolant opening 22, disposing 140 the cover 20 including the spigot seal 24 adjacent to the electronic module 12, such that the spigot 18 of the floating cold plate 16 extends through the spigot seal 24, creating a seal between the spigot 18 and the spigot seal 24; attaching 150 the cover 20 to the electronic module compartment 14 using a plurality of fasteners 15; rotating 160 the nut 30 of the spigot seal 18 with respect to the lower housing 26 of the spigot seal 24, creating a seal between the cover 20 and the spigot seal 24; and providing 170 coolant from a cooling system 23 to the floating cold plate 16 through the spigot 18.

The spigot 18 includes stanchion portion 18A and a connection portion 18B.

The spigot seal 24 includes a lower housing 26 including at least one seal 28, and a nut 30 that is engageable with the lower housing 26 to form a seal between the spigot seal 24 and the floating cold plate 16.

The lower housing 26 includes a horizontal portion 34, adjacent to a bottom surface of the cover 20, and a vertical portion 38. The vertical portion 38 of the lower housing 26 is adjacent to an outer surface 40 of the spigot 18 when the cover 20 is disposed adjacent to the electronic module 12 disposed within the electronic module compartment 14.

The at least one seal 28 includes a first seal 28A and a second seal 28B.

The first seal 28A is disposed between an inner surface 42 of the vertical portion 38 of the lower housing 26 and the outer surface 40 of the spigot 18. The second seal 28B is disposed between a bottom surface 36 of the cover 20 and an inner surface 44 of the horizontal portion 34 of the lower housing 26.

Disposing the cover 20 adjacent to the electronic module 12 includes compressing the first seal 28A between the vertical portion 38 of the lower housing 26 and the spigot 18, and engaging the nut 30 with the lower housing 26 to compress the second seal 28B between the horizontal portion 34 of the lower housing 26 and the cover 20.

The lower housing 26 includes a threaded portion 46A on an outer surface 46 of the vertical portion 38, and the nut 30 includes a threaded portion 48 that is engageable with the threaded portion 46A of the vertical portion 38 of the lower housing 26.

Engaging the nut 30 includes rotating the nut 30 clockwise with respect to the spigot 18.

The floating cold plate 16 includes at least one anti-rotation feature 50. The lower housing 26 includes at least one complementary anti-rotation feature 52 that is engageable with the anti-rotation feature 50 of the floating cold plate 16 when the nut 30 is engaged with the lower housing 26 to compress the second seal 28B between the horizontal portion 34 of the lower housing 26 and the cover 20.

The electronic module 12 includes a binary data unit.

Accordingly, the presently disclosed floating cold plate scaling system 10 for a vehicle seals along a plurality of axes by providing a cover 20 including a spigot seal 24 that locates on a spigot 18 of a floating cold plate 16 in an XY-direction, slides onto the spigot 18 in a Z-direction, creating a seal between the spigot 18 and the cover 20, and slides with respect to the cover 20 in an XY-direction, to seal against the cover 20 and the spigot seal 24.

While the presently disclosed floating cold plate sealing system 10 for a vehicle seals along a plurality of axes to compensate for dimensional stack variation, when positioning on multiple axes, to prevent coolant from entering an electronic module compartment 14, it should be appreciated that the floating cold plate sealing system 10 could be adapted to a variety of compartments and/or barriers that require scaling along a plurality of axes, where dimensional stack variations may present challenges sealing the compartment and/or barrier using traditional fixed position scaling methods.

Additionally, while scaling along the plurality of axes, the presently disclosed floating cold plate sealing system 10 also seals with respect to the spigot 18 of the floating cold plate 16, and with respect to the cover 20, which is generally formed from a sheet molded compound, without deforming the cover 20.

As used herein, a system, apparatus, structure, article, element, component, or hardware "configured to" perform a specified function is indeed capable of performing the specified function without alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware that enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to", "operative to" and/or as being "operable to" perform that function.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Accordingly, the disclosure and the figures are to be regarded as illustrative rather than restrictive.

What is claimed is:

1. A floating cold plate spigot sealing system for a vehicle, comprising:
    an electronic module disposed within an electronic module compartment that is attached to a vehicle;
    a floating cold plate having a spigot and at least one anti-rotation feature, wherein the floating cold plate is disposed adjacent to the electronic module;
    a cover having a coolant opening, wherein the cover is disposed adjacent to the electronic module;
    a spigot seal disposed in the coolant opening of the cover, wherein the spigot extends through the spigot seal disposed in the coolant opening of the cover, the spigot seal including:
        a lower housing arranged between the cover and the floating cold plate, wherein the lower housing includes:
            at least one seal; and
            at least one complementary anti-rotation feature that is engageable with the at least one anti-rotation feature of the floating cold plate; and
        a nut arranged adjacent to a top surface of the cover, wherein the nut is engageable with the lower housing to form a seal between the spigot seal and the cover; and a cooling system attached to the vehicle, wherein the cooling system provides coolant to the floating cold plate through the spigot.

2. The floating cold plate spigot sealing system, as recited in claim 1, wherein the lower housing includes a horizontal portion, and a vertical portion, wherein the horizontal portion is adjacent to a bottom surface of the cover, and the vertical portion is adjacent to an outer surface of the spigot, when the cover is disposed adjacent to the electronic module.

3. The floating cold plate spigot sealing system, as recited in claim 2, wherein the at least one seal includes a first seal and a second seal.

4. The floating cold plate spigot sealing system, as recited in claim 3, wherein the first seal is disposed between an inner surface of the vertical portion of the lower housing and the outer surface of the spigot, and the second seal is disposed between the bottom surface of the cover and an inner surface of the horizontal portion of the lower housing.

5. The floating cold plate spigot sealing system, as recited in claim 3, wherein, when the cover including the spigot seal is disposed on the spigot of the floating cold plate, the first seal is compressible between the vertical portion of the lower housing and the spigot to form a seal between the spigot seal and the spigot, and
wherein the second seal is compressible between the horizontal portion of the lower housing and the bottom surface of the cover, when the spigot is received within the spigot seal, and the nut is engaged with the lower housing to form the seal between the spigot seal and the cover.

6. The floating cold plate spigot sealing system, as recited in claim 1, wherein the lower housing includes a threaded portion on an outer surface of a vertical portion of the lower housing, and the nut includes a threaded portion that is engageable with the threaded portion of the vertical portion of the lower housing.

7. The floating cold plate spigot sealing system, as recited in claim 1, wherein the electronic module includes a binary data unit.

8. The floating cold plate spigot system as recited in claim 1, wherein the spigot includes a stanchion portion and a connection portion.

9. A floating cold plate spigot sealing system for a vehicle, comprising:
an electronic module attached to a vehicle;
a floating cold plate including a spigot and at least one anti-rotation feature, wherein the floating cold plate is disposed adjacent to a first side of the electronic module;
a cover including a spigot seal disposed in a coolant opening of the cover, wherein the cover is disposed adjacent to a second side of the electronic module, wherein the second side of the electronic module is opposite the first side of the electronic module, wherein, when the cover is disposed adjacent to a second side of the electronic module, the spigot extends through the spigot seal to form a seal between the spigot and the spigot seal, the spigot seal including:
a lower housing arranged between the cover and the floating cold plate, wherein the lower housing includes:
at least one seal; and
at least one complementary anti-rotation feature that is engageable with the at least one anti-rotation feature of the floating cold plate; and
a nut arranged adjacent to a top surface of the cover, wherein the nut is engageable with the lower housing to form a seal between the spigot seal and the cover; and
a cooling system providing coolant to the floating cold plate through the spigot.

10. A method of sealing a floating cold plate spigot for a vehicle, comprising:
attaching an electronic module to a vehicle;
disposing a floating cold plate, having a spigot and at least one anti-rotation feature, adjacent to the electronic module;
providing a cover having a coolant opening, and a spigot seal disposed within the coolant opening, the spigot seal including:
a lower housing arranged between the cover and the floating cold plate, the lower housing including at least one seal and at least one complementary anti-rotation feature that is engageable with the at least one anti-rotation feature of the floating cold plate; and
a nut arranged adjacent to a top surface of the cover, wherein the nut is engageable with the lower housing to form a seal between the spigot seal and the cover; and
disposing the cover adjacent to the electronic module, wherein the spigot of the floating cold plate extends through the spigot seal;
attaching the cover to the electronic module compartment using a plurality of fasteners;
rotating the nut of the spigot seal with respect to the lower housing of the spigot seal; and
providing coolant from a cooling system to the floating cold plate through the spigot.

11. The method of sealing a floating cold plate spigot, as recited in claim 10, wherein the lower housing includes a horizontal portion, adjacent to a bottom surface of the cover, and a vertical portion, and wherein the vertical portion of the lower housing is adjacent to an outer surface of the spigot when the cover is disposed adjacent to the electronic module.

12. The method of sealing a floating cold plate spigot, as recited in claim 11, wherein the at least one seal includes a first seal and a second seal.

13. The method of sealing a floating cold plate spigot, as recited in claim 12, wherein the first seal is disposed between an inner surface of the vertical portion of the lower housing and the outer surface of the spigot, and the second seal is disposed between the bottom surface of the cover and an inner surface of the horizontal portion of the lower housing.

14. The method of sealing a floating cold plate spigot, as recited in claim 13, wherein disposing the cover adjacent to the electronic module includes:
compressing the first seal between the vertical portion of the lower housing and the spigot;
engaging the nut with the lower housing to compress the second seal between the horizontal portion of the lower housing and the cover.

15. The method of sealing a floating cold plate spigot, as recited in claim 14, wherein the lower housing includes a threaded portion on the outer surface of the vertical portion, and the nut includes a threaded portion that is engageable with the threaded portion of the vertical portion of the lower housing.

16. The method of sealing a floating cold plate spigot, as recited in claim 14, wherein engaging the nut includes rotating the nut with respect to the spigot.

17. The method of sealing a floating cold plate spigot, as recited in claim 14, wherein the at least one anti-rotation feature of the floating cold plate is engageable with the at least one complementary anti-rotation feature of the floating cold plate when the nut is engaged with the lower housing to compress the second seal between the horizontal portion of the lower housing and the cover.

18. The method of sealing a floating cold plate spigot, as recited in claim 10, wherein the electronic module includes a binary data unit.

19. The method of sealing a floating cold plate spigot, as recited in claim 10, wherein the spigot includes a stanchion portion and a connection portion.

\* \* \* \* \*